(12) United States Patent
Kolis et al.

(10) Patent No.: US 7,563,320 B2
(45) Date of Patent: Jul. 21, 2009

(54) HYDROTHERMAL METHOD FOR PREPARING LARGE SINGLE CRYSTALS OF SCANDIUM, YTTRIUM, AND LANTHANIDE SESQUIOXIDES

(76) Inventors: Joseph Kolis, 195 Warbranch Rd., Central, SC (US) 29630; Colin D. McMillen, 150 Ligon St., #402, Clemson, SC (US) 29631

( * ) Notice: Subject to any disclaimer, the term of this patent is extended or adjusted under 35 U.S.C. 154(b) by 97 days.

(21) Appl. No.: 12/002,551

(22) Filed: Dec. 18, 2007

(65) Prior Publication Data

US 2009/0151621 A1 Jun. 18, 2009

(51) Int. Cl.
*C30B 11/14* (2006.01)
*C01F 17/00* (2006.01)

(52) U.S. Cl. .................. 117/70; 117/2; 117/3
(58) Field of Classification Search .......... 117/2, 117/3, 70; 423/263, 277
See application file for complete search history.

(56) References Cited

U.S. PATENT DOCUMENTS

| | | | | |
|---|---|---|---|---|
| 4,980,141 | A * | 12/1990 | Kimura et al. | 423/263 |
| 7,211,234 | B2 * | 5/2007 | Kolis et al. | 423/263 |
| 2006/0147363 | A1 * | 7/2006 | Kolis | 423/263 |
| 2009/0060813 | A1 * | 3/2009 | Burton | 423/277 |

OTHER PUBLICATIONS

Simura et al., "Growth and spectroscopic properties of Yb3+-doped Sc2O3 crystals grown by the micro-pulling-down method," Optical Materials 30 (2007), pp. 18-21.
Kuck et al., "Spectroscopic properties of Cr-doped Sc2O3," J. Luminescence 87-89 (2000), pp. 112-1125.
Masui et al., Electrochemical Sc2O3 single crystal growth, J. Alloys and Compounds 374 (2004), pp. 97-100.
Boulon et al., "Energy transfer and cooperative processes in Yb3+-doped cubic sesquioxide ceramics and crystals," J. Luminescence 125 (2007), pp. 45-54.
Chen et al., "The Flux Growth of Scandium Oxide Crystals," J. Crystal Growth 104 (1990), pp. 672-676.
Klopp et al., "Highly Efficient mode-locked Yb:Sc2O2 laser," Optics Letters, v. 29, No. 4, Feb. 15, 2004, pp. 371-393.
Petermann et al., "Highly Yb-doped oxides for thin-disc lasers," J. Crystal Growth 275 (2005), pp. 135-140.
Mun et al., "Growth and characterization of Tm-doped Y2O3 single crystals," Optical Materials 29 (2007), pp. 1390-1393.
Fornasiero et al., "New Oxide Crystals for Solid State Lasers," Cryst. Res. Technol. 34 (1999) pp. 225-260.
Laversenne et al., "Optimization of spectroscopic properties of Yb3+-doped refractory sesquioxides: cubic Y2O3, Lu2O3 and monoclinic Gd2O3," Opt. Mat. 16 (2001), pp. 475-483.

* cited by examiner

*Primary Examiner*—Felisa C Hiteshew
(74) *Attorney, Agent, or Firm*—Leigh P Gregory

(57) ABSTRACT

Scandium, yttrium, and lanthanide sesquioxide crystals having the formula $Ln_2O_3$, wherein Ln is selected from Sc, Y, La, Ce, Pr, Nd, Pm, Sm, Eu, Gd, Tb, Dy, Ho, Er, Tm, Yb, and Lu, with or without an activator ion, are made by a hydrothermal method for a variety of end-use applications.

13 Claims, No Drawings

HYDROTHERMAL METHOD FOR PREPARING LARGE SINGLE CRYSTALS OF SCANDIUM, YTTRIUM, AND LANTHANIDE SESQUIOXIDES

FIELD OF THE INVENTION

The present invention is directed to scandium, yttrium, and lanthanide oxide crystals having the formula $Ln_2O_3$, wherein Ln is selected from Sc, Y, La, Ce, Pr, Nd, Pm, Sm, Eu, Gd, Tb, Dy, Ho, Er, Tm, Yb, and Lu, with or without an activator ion, made by a hydrothermal method for a variety of end-use applications. Specifically, when made by the present hydrothermal method, single crystals of a size sufficient for use in a variety of applications are readily formed.

BACKGROUND OF THE INVENTION

The lanthanide sesquioxides ($Ln_2O_3$) are of considerable commercial and military importance in high-powered laser applications. Typically they can act as hosts for activator ions in pumped solid-state lasers. In most solid-state lasers (as distinct from diode lasers) the device consists of a "pump" and an "emitter." The emitter consists of the "host" and the "activator ion." The pump can be a variety of energy sources and is typically a flash lamp, bright beam, or diode laser. These shine into the emitter to excite the activator ions to achieve a population inversion.

The activator ion is typically a metal ion that can absorb photons from the pump to achieve a population inversion. This inversion is created by a situation whereby an excited electronic state is more heavily populated than the energetic ground state. When this population inversion is achieved, the emitter "lases" or emits coherent radiation, namely a stream of photons that are of all the same wavelength and are in phase. Typically the activator ions are metal ions containing partially occupied d or f valence shells. Thus they can be, but are not limited to, $Cr^{3+}$, $Ti^{3+}$, $Cr^{2+}$ (containing partially filled d valence electron shells) or many of the trivalent lanthanide ions containing partially filled f valence electron shells (often, but not limited to, $Nd^{3+}$, $Pr^{3+}$, $Yb^{3+}$, $Er^{3+}$, $Tm^{3+}$, etc.). In a practical working solid-state laser, the concentration of activator ions in the host is fairly small, typically less than 1% by weight. The relatively low concentration is often preferred because of various deleterious relaxation events that can occur at higher concentrations.

The host has several requirements to perform well. It must readily accommodate the activator ion at the desired concentration (for example, 0.5-10% metal ion concentration) and generally form well in the preferred physical form (i.e., a large single crystal, a transparent ceramic slab, etc.). It typically must be electronically "innocent" in that it does not absorb pump photons or otherwise become involved in the electronic activity, absorption emission or other quantum mechanical events involved in lasing. It must have good ligand field properties so that the activator ion has good absorption cross-sections, appropriate lifetimes, suitable Stark levels and good emission behavior. It must have other physical and electronic properties that do not inhibit the performance of the activator ion (i.e. low thermal lensing, low birefringence, high optical damage threshold, etc.).

In modern lasers the typical pump source is a diode laser that pumps the host containing a suitable activator ion, wherein the host is a single crystal, a fiber or a transparent ceramic glass. As a general class these are typically called diode pumped solid-state lasers or DPSSLs. In high-powered lasers a typical design involves numerous diode lasers all simultaneously pumping a lasing emitter. Thus depending on power requirements more than 60 diode lasers can simultaneously pump one emitter.

The requirements for high-powered lasers (typically those with 1-100 kW power) include all of the traditional requirements as well as several other requirements that must be addressed for technological development. In particular there are several issues related to thermal management and thermal stability that are of extreme importance. All pumped solid-state lasers generate some amount of waste heat. This is because the pump typically excites the activator ion to an excited state that contains more energy than the emissive state. Thus the activator ion typically absorbs a photon from the pump to an excited state which then emits a small amount of energy before it lases, often relaxing from a higher energy Stark level to a lower energy Stark level. This slightly less energetic state is then the one that emits the coherent radiation or laser light. The small amount of energy that is emitted after excitation and before laser emission is typically given off as heat. For normal DPSSLs this excess heat is readily removed through a variety of standard water or air-cooling techniques. However, for lasers of extremely high power, i.e., greater than 100 W, the waste heat is often large enough to create a significant barrier to performance. The excess heat can cause decomposition of the host, phase changes or irregular thermal expansion that distorts the laser light (thermal tensing). Thus hosts for high-powered lasers must, in addition to the regular host requirements, have exceptional thermal stability and good thermal conductivity if they can be used in practical working devices. High thermal conductivity is a key requirement for good high powered laser hosts because the typical design envisions a slab or other shape that allows for substantial contact of the host with a heat drain such as a cooled metal. Good thermal conductivity allows for efficient waste heat removal from the host to the heat drain. The most common hosts for DPSSLs are usually metal oxides, which typically have relatively poor thermal conductivity. Thus the most desirable hosts for high-powered DPSSLs are the few oxides with outstanding thermal stability and decent thermal conductivity.

One class of new laser hosts that offer substantial advantages when implemented in high powered DPSSLs are the lanthanum sesquioxides $Ln_2O_3$ where Ln is typically chosen from the lanthanides or rare earths and commonly includes but is not limited to Sc, Y, La, Lu or Gd. These metal ions when in the form of their sesquioxides ($Ln_2O_3$) typically have very good ligand field properties as laser hosts. Thus they have fairly broad absorption bands, reasonable Stark level splittings, low phonon energies and long excited state lifetimes. These properties typically lead to desirable laser characteristics such as good cross sections and low thresholds. In addition the sesquioxides have several properties that give them improved performance as high-powered laser hosts. They have exceptional thermal stability, melting at extremely high temperatures (>2400° C.) and not undergoing any phase changes. Most importantly they have relatively high thermal conductivity. For example, $Sc_2O_3$ has a thermal conductivity about 50% greater than YAG ($Y_3Al_5O_{12}$), which is one of the most common and standard DPSSL hosts in current practical devices. The use of the lanthanum sesquioxides as hosts is a considerable improvement because their high thermal conductivity enables the construction of high-powered DPSSLs where a slab or disc of the doped host can be placed on a metal cooling disc to drain the waste heat allowing for extreme pumping to very high powers.

There is, however, one significant drawback that prevents the implementation of the $Sc_2O_3$ and the other lanthanide sesquioxides as laser hosts in commercial devices. That drawback is the lack of high quality material available on a commercial or even experimental scale. While the oxides of appropriate formula $Ln_2O_3$ are readily commercially available, they are all in the form of powders with very small particle size. Such powders are worthless as hosts for DPSSLs. DPSSLs require a well-formed bulk sample of a size sufficient to align in a pump beam, can be coated with appropriate reflective coating and most importantly, have sufficient surface area to come in contact with a heat drain. However, manufacture of these materials in a form suitable for use in DPSSLs is extremely problematic. The forms most desirable for hosts in DPSSLs are high quality single crystals. In this case, the host is one single crystal of a size suitable for use (typically greater than 5 mm per edge) uniformly doped throughout with the appropriate concentration of the desired activator ion ($Nd^{3+}$, $Yb^{3+}$ or related). However, such single crystals are not easily obtained. The source of the difficulty lies in the extremely high melting point of these sesquioxides. Most of the lanthanide oxides $Ln_2O_3$ have melting points in excess of 2400° C. For example, $Sc_2O_3$ melts at 2460° C. and $Y_2O_3$ melts at 2430° C. These extreme melting points make growth of high quality single crystals suitable for DPSSLs very difficult. Typically high quality single crystals suitable for commercial optoelectronic applications are grown though a melt technique such as Czochralski pulling or Bridgeman growth. These all involve some form of melting and slow cooling of the pure oxide. Other related methods include top seeded solution growth or flux growth. These methods require a suitable flux that imparts reasonable solubility to the target compound. Other more exotic methods are sometimes employed such as laser pedestal heating or optical floating zone growth. These latter two are sometimes called containerless growth because, as their name implies, they do not require a container to hold the melt during growth.

These methods all have serious drawbacks for optimal growth and commercial production. The high melt temperature discourages the use of traditional Czochralski or Bridgeman methods because they require a high temperature crucible to grow. However, the only crucible material suitable to these extreme temperatures is Rhenium but at such high temperatures, the rhenium metal of the container becomes volatile and tends to impregnate the crystal during growth. These metal impurities lead to significant loss of performance as a DPSSL. Recently single crystals of Yb doped $Sc_2O_3$ were grown by the less common heat exchanger method and gave promising preliminary results as DPSSLs. However, this technique is somewhat exotic and not commonly used for commercial production of laser hosts. As discussed above, such growth of single crystals at extremely high temperatures typically leads to thermal strain, and thermally induced defects. During operation at high powers extreme heat is generated. Unfortunately under such extreme heat these defects lead to significant problems and the crystals perform very poorly making them not useful in high-powered lasers.

A more recent technology does not require the use of large single crystals of lanthanum oxides as laser hosts, but rather relies on the formation of transparent ceramics. In this technique, a suitably doped nanopowder of the host $Ln_2O_3$ is prepared by standard ceramic precursor methods and then heated and hot pressed under suitable vacuum conditions to form a clear solid ceramic slab. This technique has considerable promise in that it can lead to large (several centimeter) transparent slabs doped with the appropriate emitter ion at nearly any desired concentration. The performance of these materials is reasonable and comparable to that of the small single crystals prepared by the heat exchanger method described above. However, these materials are still ceramics that contain multiple grain boundaries. They are not single crystals so will not have the optimized ligand field parameters. Also the presence of large numbers of grain boundaries will limit the thermal conductivity of the solid in high-powered DPSSLs. There will also be applications where single crystal hosts will be necessary for optimized performance. Thus large single crystals of the lanthanide sesquioxides $Ln_2O_3$ are still the most desirable form of hosts for high-powered DPSSLs.

Hydrothermal crystal growth is one method to grow large single crystals of refractory oxides. It has been applied to a variety of oxides including quartz (SiO2), sapphire (Al2O3), potassium titanyl phosphate and several other materials. In this technique, a feedstock of powder or small crystals is placed in an autoclave or other high-pressure container. Typically one or more seed crystal is suspended above this feedstock. An aqueous solution is placed in the autoclave with a mineralizer dissolved therein. A mineralizer is typically a small ion like $OH^-$, halide carbonate or $H^+$ that induces a slight degree of solubility of the feedstock at high temperature. After the autoclave is sealed, it is heated to a temperature above the boiling point of water. Most commonly to induce large crystal growth, the autoclave is differentially heated such that the feedstock is in a hot zone and the seed crystal is in a cooler zone of temperature. Thus under suitable conditions, a supersaturation effect can be created so that feedstock is transported through the fluid and continuously deposited on the seed crystals to create a growing single crystal that can, in principal, grow as large as the autoclave or until the feedstock is exhausted. However, the formation of crystals by hydrothermal growth is highly dependant on the choice of mineralizer, concentration of mineralizer, growth temperature, thermal gradient, pressure, time and many other parameters. These vary widely for each particular crystal. Not all materials can be grown using this technique. This application has never been reported for the production of any lanthanide oxide crystals.

The older scientific literature contains several reports of the various lanthanide oxides exposed to hydrothermal conditions, namely water at the temperatures and pressures approximating those in this invention 300-700° C. at 5-20, 000 pounds/square inch pressure. However, these reports were mainly concerned with the stability and phase relations of the metal oxides and their hydrated relatives. There is no report of large (greater than one millimeter) single crystal growth. Specifically, all the work in these papers describe powder, not crystal, formation.

SUMMARY OF THE INVENTION

Accordingly, the present invention is directed to a method for growing large single crystals of lanthanide sesquioxides suitable, with or without activator ions, for a variety of end-use applications.

Specifically, the present invention is directed to a method for growing scandium oxide crystals having the formula $Sc_2O_3$, which includes the steps of dispersing $Sc_2O_3$ powder in an aqueous solution having an hydroxide ion concentration of from about 1 to about 30 molar, and subjecting the solution to a temperature of from about 450° C. to about 700° C. and a pressure of from about 4 kpsi to about 30 kpsi. Preferably, the hydroxide ion concentration is from about 15 to about 25 molar, the temperature ranges from about 450° C. to about 550° C., the pressure ranges from about 15 kpsi to about 20 kpsi, and the aqueous solution is subjected to the elevated temperature and pressure for a period of from about one to three weeks.

Further, the present is directed to a method for growing lanthanide oxide crystals having the formula $Ln_2O_3$, wherein Ln is selected from the group consisting of the lanthanide elements ranging from La to Lu and Y, which includes the steps of dispersing $Ln_2O_3$ powder in an aqueous solution having an hydroxide ion concentration of from about 1 to about 30 molar, and subjecting the solution to a temperature of from about 640° C. to about 750° C. and a pressure of from about 15 kpsi to about 40 kpsi. Preferably, the hydroxide ion concentration is from about 15 to about 25 molar, the temperature ranges from about 640° C. to about 750° C., the pressure ranges from about 15 kpsi to about 30 kspi, and the aqueous solution is subjected to such elevated temperature and pressure for a period of from about one to three weeks.

Additionally, the present invention is directed to a method for growing a lanthanide oxide crystal having the formula $Ln_xLn'_{(2-x)}O_3$ wherein $Ln_x$ is selected from the group consisting of Sc, Y, Gd, La and Lu, and wherein Ln' is selected from the group consisting of Er, Pr, Yb, Nd, Ho, Tm, Tb, Cr, Ti and any other lanthanide or transition metal having a 3+ ionic charge, which includes the steps of dispersing $Ln_xLn'_{(2-x)}O_3$ powder in an aqueous solution having an hydroxide ion concentration of from about 1 to about 20 molar, and subjecting the solution to a temperature of from about 450° C. to about 700° C. and a pressure of from about 10 kpsi to about 30 kpsi.

Still further, the present invention is directed to a method for growing a lanthanide oxide crystal having the formula $Ln_2O_3$ wherein Ln is selected from the group consisting of Sc, Y, La, Lu, and Gd, which includes the steps of providing a pressure vessel having a growth region and a nutrient region, providing a seed crystal having the formula $Ln_2O_3$ wherein Ln is selected from the group consisting of Sc, Y, La, Lu, and Gd, positioning the seed crystal in the growth region of the pressure vessel, providing a medium including a nutrient and a mineralizer in the nutrient region, wherein the nutrient is powdered or microcrystalline $Ln_2O_3$ wherein Ln is the Ln of the seed crystal, wherein the mineralizer is hydroxide ions, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 450° C. to about 650° C., the nutrient temperature ranging from about 500° C. to about 750° C., the nutrient temperature being higher than the growth temperature and the pressure ranging from about 4 kpsi to about 30 kpsi.

Furthermore, the present invention is directed to a method for growing a lanthanide oxide crystal having the formula $Ln_xLn'_{(2-x)}O_3$ wherein Ln is selected from the group consisting of Sc, Y, La, Lu, and Gd, and wherein Ln' is selected from the group consisting of Er, Pr, Yb, Nd, Ho, Tm, Tb, Cr, Ti and any other lanthanide or transition metal having a 3+ ionic charge, which includes the steps of providing a pressure vessel having a growth region and a nutrient region, providing a seed crystal having the formula $Ln_2O_3$ or $Ln_xLn'_{(2-x)}O_3$ wherein Ln is selected from the group consisting of Sc, Y, La, Lu, and Gd and wherein Ln' is selected from the group consisting of Er, Pr, Yb, Nd, Ho, Tm, Tb, Cr, Ti and any other lanthanide or transition metal having a 3+ ionic charge, positioning the seed crystal in the growth region of the pressure vessel, providing a medium comprising a nutrient and a mineralizer in the nutrient region, the nutrient comprising powdered or microcrystalline $Ln_xLn'_{(2-x)}O_3$ wherein Ln and Ln' are the Ln and Ln' of the seed crystal, the mineralizer comprising hydroxide ions. And heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 450° C. to about 650° C., the nutrient temperature ranging from about 500° C. to about 750° C., the nutrient temperature being higher than the growth temperature and the pressure ranging from about 4 kpsi to about 30 kpsi.

DETAILED DESCRIPTION OF THE PREFERRED EMBODIMENTS

The present invention is directed to a method of growing single crystals of scandium, yttrium and the various lanthanide sesquioxides using a hydrothermal technique. The invention allows for the growth of single crystals at a temperature much lower than the melting point or any previously reported methods. The invention also includes a number of variations of the method that allow for the growth of single crystals through a transport method that enable the growth of single crystals that approach or exceed one centimeter on edge, a size that is normally the minimum required for cutting, polishing coating and otherwise preparing for use in real laser systems. Further, the present invention is directed to a technique for growing relatively small (greater than 0.5 millimeters but less than three millimeters per edge) spontaneously nucleated single crystals, as well as a technique to transport, by way of a hydrothermal fluid using appropriate mineralizers, a suitable feedstock through the hydrothermal fluid to an appropriate seed crystal whereby the seed crystal can grow to a size that is only limited by the size of the container. Specifically, the present invention employs variations of this methodology to create single crystals of the various $Ln_2O_3$ formulations of a size and quality suitable for use as lasing crystals in DPSSLs.

The invention also encompasses a method for the systematic "doping" of the crystals with activator ions. Thus the parent host system, typically $Sc_2O_3Y_2O_3$, $Gd_2O_3$ or $La_2O_3$ can be grown as large single crystals with the trivalent lanthanide ion sites partially substituted with other trivalent metal ions that contain partially filled d or f valence shells. These partially filled d and f shells create electronic states that can absorb photons of an appropriate wavelength ("pumping") and then emit coherent light ("lasing"). There is little if any limitation to the concentration or identity of the trivalent ion that can act as a doping ion. Most combinations of trivalent elements can be incorporated into the single crystals using the hydrothermal method disclosed herein. Thus the present invention is also directed to a series of methods to form single crystals of the broad general series $Ln_xLn'_{(2-x)}O_3$, where Ln represents Sc, Y, La, Gd, Lu or Yb and Ln' represents all the various combinations of the trivalent lanthanides Y—Lu that contain partially filled valence f-orbitals as well as the various transition metal trivalent ions that contain unfilled valence d-orbitals such as $Cr^{3+}$, and $Ti^{3+}$. These mixed metal crystals contain the appropriate host ion as well as the various activators along with various sensitizers and related ions all of which are used in DPSSLs.

Thus, the scope of the invention disclosed herein involves a hydrothermal technique as a route to the single crystals of the formula $Ln_2O_3$ and $Ln_xLn'_{(2-x)}O_3$, where the crystals are of sufficient size and quality to be used as the source for diode pumped solid state lasers. The present hydrothermal method also enables spontaneous growth of relatively smaller single crystals (between 0.5-3 mm per edge) in a hydrothermal fluid further described below. This spontaneous growth method involves a suitable feedstock material, an aqueous hydrothermal fluid containing a suitable mineralizer combination sealed in an autoclave sometimes within a sealed precious metal ampoule. This container is heated to a suitable temperature greater than the boiling point of water, typically between 300 and 700° C. for a period of typically greater than two days but less than several weeks. Such heating is usually accomplished using an external resistance heater or furnace. The heating generates a pressure that is a function of the percentage of water relative to open space in the container and the final temperature. The pressure is typically greater than 5,000 pounds/square inch (psi) but less than 45,000 psi. Such pressures are contained by the use of autoclaves made of alloys capable of resisting high temperatures without flow, creep or oxidation, typically nickel based alloys such as Inconel or Rene. Normally the autoclave has sufficient mechanical strength to contain the pressures but is not sufficiently chemically inert to resist attack by the hydrothermal solution and mineralizer. Thus the actual reaction fluid, feedstock and crystals are sealed within a liner made of an inert precious metal such as silver, gold or platinum. Such liners can be either "floating" ampoules that are welded shut and placed in the metal autoclave and counter-pressured appropriately to prevent bursting, or fitted to the inner wall of the autoclave ("fixed" liner) and sealed by arc or pressure welding within the autoclave after addition of all ingredients for crystal growth. In this case the fixed liner does not require counter-pressure because its shape mimics that of the inside of the autoclave so the walls of the liner are supported by the mechanical strength of the autoclave preventing bursting.

In addition to the crystals of formula $Ln_2O_3Ln_xLn'_{(2-x)}O_3$, where Ln and Ln' are the various trivalent lanthanides, grown by spontaneous nucleation described above, larger crystals can be grown by a related transport technique in hydrothermal fluids. In this related technique a feedstock is placed in an autoclave in a configuration as described above. A mineralizer is added also as described above. The primary difference in this technique is that in this embodiment one or more seed crystals of the desired material is suspended near the top of the autoclave. The seed or seeds can be suspended by a number of methods including wrapping in a noble metal wire and hung from an appropriate hook or "ladder" or it can be placed in a mesh cage or can be drilled and a noble metal wire passed through it to suspend by a hook. The seeds are typically of the same chemical formula and composition as the feedstock and the desired target material.

After sealing, the autoclave is heated to an appropriate temperature. In the case of the lanthanide sesquioxides of formula $Ln_xLn'_{(2-x)}O_3$, the temperature ranges from 350-700° C. depending on the formula and desired rate of growth. Typically the heating is contrived so as to create a thermal gradient whereby the top of the autoclave is between 20° and 100° Cooler than the bottom of the autoclave where the feedstock is located. This thermal gradient creates a supersaturation condition whereby a small quantity of feedstock is dissolved by the mineralizer in the hotter zone, and the soluble species is transported by convection to the seed crystal. Because of the supersaturation effect, the dissolved species is deposited on the seed crystal causing it to grow in size slightly. The depleted fluid is now cooler and denser than the new hot fluid rising from below. As such it is transported to the hotter zone where the process begins again. By this continuous process the seed crystal slowly grows larger. Over a period of several weeks the seek crystals can get quite large and under optimum conditions can actually grow to the size of the interior of the autoclave.

Additional illustrations of the present invention are provided by the following specific examples.

EXAMPLE 1

General Spontaneous Nucleation of $Sc_2O_3$ Crystals

Spontaneously nucleated crystals of $Sc_2O_3$ can be grown hydrothermally over a wide range of reaction conditions described in general by this example. Such crystal growth occurs within an inert precious metal liner (silver, gold or platinum). The liner can be in the form of a floating welded ampoule or a fixed sealed liner, both of which are contained by an autoclave constructed from a high-pressure, high-temperature superalloy such as Rene 41 or Inconel 718. Powdered $Sc_2O_3$ was weighed and placed in the liner with solid KOH and deionized water that served as the mineralizer. KOH masses corresponding to effective concentrations ranging from 1-30 molar were used. The contents were sealed within the liner, and in the case of the floating liner the autoclave containing it was counter-pressured with water to prevent the ampoule from bursting. The autoclave was then heated to the desired temperature and held at that temperature for up to 3 weeks. The temperature for the reactions ranged from 450-700° C. and the pressure generated was 5-30 kpsi. Upon completion of the experiment, the vessel was allowed to cool to room temperature over a period of 12 hours. The liners were opened and the single crystals of $Sc_2O_3$ were harvested.

EXAMPLE 2

Preferred Conditions for $Sc_2O_3$ Spontaneous Nucleation 1.2 g (8.7 mmol) of $Sc_2O_3$ powder was weighed and placed in a 0.375" diameter silver ampoule along with 4.5 g of KOH. 4 mL of deionized water was added to the ampoule corresponding to an effective hydroxide mineralizer concentration of 20 M. The ampoule was weld-sealed, placed in an autoclave and counter-pressured with water. The autoclave was placed in a vertical furnace and heated to 610° C., subsequently establishing a temperature gradient of 75° C. over the length of the reaction ampoule inside. The autoclave was held at these thermal conditions and a pressure of 16 kpsi for 14 days. The autoclave was then cooled to room temperature over a 12 hour period. The ampoule was removed from the autoclave and opened, revealing clear colorless cubes distributed throughout the ampoule. 3×3×3 mm crystals were separated and identified as $Sc_2O_3$ using x-ray methods.

EXAMPLE 3

Preferred Conditions for $Ln:Sc_2O_3$ Spontaneous Nucleation

This example relates to the spontaneous nucleation of $Yb_{0.02}Sc_{1.98}O_3$ crystals based the hydrothermal method described in Examples 1 and 2. $Sc_2O_2$ and $Yb_2O_3$ were used as starting materials and molar amounts of each (7.2 mmol $Sc_2O_3$ and 0.076 mmol $Yb_2O_3$) were weighed in a proportion corresponding to the desired final composition $Yb_{0.02}Sc_{1.98}O_3$. The oxides were added to a silver ampoule along with 4.5 g of KOH and 4 mL of deionized water that comprised the mineralizer. The ampoule was welded shut and placed in an autoclave. After counter-pressuring the ampoule with water, the autoclave was heated in a vertical furnace to 630° C., generating a pressure of 15.7 kpsi. A temperature gradient of 85° C. was established, and the reaction remained under these conditions for 7 days. At the conclusion of the experiment, the crystals were harvested as described in Example 2. Single crystals up to 2.5×2.5×2.5 mm in size were obtained and characterized as 1% Yb:$Sc_2O_3$ using x-ray and spectroscopic methods. The quantity of the dopant was verified using EDX and single crystal x-ray diffraction. Expansion of the unit cell of the doped crystals was consistent with Vegard's Law and the dopant level matched the desired composition from the starting charge.

EXAMPLE 4

General Method to Grow $Sc_2O_3$ Using a Hydrothermal Transport Growth Process

Like the previous examples for spontaneous nucleation, transport crystal growth can be achieved in both floating and fixed liners. For transport growth, however, a seed crystal of the desired material was suspended in the growth zone (the region of cooler temperature for systems of positive grade solubility, such as the $Sc_2O_3$ system) of the liner, providing a surface upon which regular crystal growth can occur. Suspension of the seed crystal was achieved by drilling a hole in the seed crystal and tying it onto a silver frame or ladder using 0.1 mm silver wire. One or more seed crystals were used for a given experiment. A perforated baffle was also attached to the ladder serving to separate the cooler growth zone from the warmer feedstock dissolution zone and regulate the supersaturated fluid flow. The baffle was placed approximately 0.5" above the level of the feedstock, and the seed crystals hung approximately 6" above the level of the feedstock. The feedstock consisted of $Sc_2O_3$ powder or $Sc_2O_3$ crystals from previous hydrothermal experiments. The mineralizer was a hydroxide solution of 1-30 M concentration. The amount of feedstock and volume of mineralizer used can be scaled according to the total volume of the liner. Treatment of the liners with respect to the autoclave containing them is the same as in Example 1. The autoclave was heated using separate heating elements assigned to the dissolution and growth zones to carefully control the temperature gradient and optimize the growth rate. Temperatures ranged from 450-700° C. and gradients from 10-150° C. were used. Growth was allowed to continue for 1-6 weeks. At the conclusion of the growth period, the autoclave was cooled, the liner opened and the ladder with seeds removed. Growth rates were measured in terms of mass transport and size increase of the seed crystals.

EXAMPLE 5

Preferred Conditions for $Sc_2O_3$ Transport Growth Using a Hydrothermal Method

One 3×3×3 mm $Sc_2O_3$ crystal was selected from the spontaneous nucleation resulting from the experiment set forth in Example 2. A small hole was drilled in the crystal and it was hung by 0.1 mm silver wire from a silver ladder assembly described in Example 4. This assembly was placed in a 0.375" diameter silver ampoule along with 4.5 g KOH mineralizer, 4 μL deionized water and 1 g $Sc_2O_3$ feedstock (<1 mm particle size) obtained from previous hydrothermal experiments. The seed crystal was approximately 6" above the feedstock. The floating liner was weld-sealed and placed in an autoclave where it was counter-pressured with water. The autoclave was heated such that the temperature of the dissolution zone was 630° C. and the temperature of the growth zone was 560° C. The pressure generated under these conditions was 19 kpsi. Crystal growth continued for 3 weeks, at the conclusion of which the heaters were turned off allowing the autoclave to cool to room temperature. Upon opening the ampoule, significant growth was observed on the seed crystal. Some spontaneous nucleation was present, but not to the point where it was deemed detrimental to the growth rate on the seed crystal. Growth rates averaged 0.12 mm/side/day, and the seed crystal experienced a mass transport rate of 11.3 mg/day.

EXAMPLE 6

Transport Growth of 1% Yb:$Sc_2O_3$ ($Yb_{0.02}Sc_{1.98}O_3$) Using a Hydrothermal Method One 2.5×2.5×2.5 mm 1% Yb:$Sc_2O_3$ crystal was selected from the spontaneous nucleation resulting from the experiment set forth in Example 3. A small hole was drilled in the crystal and it was hung by 0.1 mm silver wire from a silver ladder assembly described in Example 4. This assembly was placed in a 0.375" diameter silver ampoule along with 2.25 g KOH, 4 mL deionized water and 1.3 g 1% Yb:$Sc_2O_3$ feedstock (<1 mm particle size) obtained from previous hydrothermal experiments. The KOH and deionized water formed a 10 M hydroxide mineralizer solution. The seed crystal was approximately 6" above the feedstock. The floating liner was weld-sealed and placed in an autoclave where it was counter-pressured with water. The autoclave was heated such that the temperature of the dissolution zone was 545° C. and the temperature of the growth zone was 470° C. The pressure generated under these conditions was 10 kpsi. Crystal growth continued for 15 days, at the conclusion of which the heaters were turned off allowing the autoclave to cool to room temperature. The ampoule was opened, revealing a large amount of growth on the seed crystal. Growth rates averaged 0.12 mm/side/day, and the seed crystal experienced a mass transport rate of 11.7 mg/day. A small amount of spontaneous nucleation was distributed evenly throughout the ampoule and some feedstock was present at the bottom.

EXAMPLE 7

Spontaneous Nucleation of Other $Ln_2O_3$ Host Materials (Ln=Y, La, Pr, Nd, Sm, Eu, Gd, Tb, D, Ho, Er, Tm, Yb, Lu)

Where $Sc_2O_3$ is the stable phase above 400° C., some other $Ln_2O_3$ phases are only stable in a temperature regime beyond 640° C. Although the procedure and technology remain the same as those described in Examples 1-3, the phase stability of $Ln_2O_3$ in aqueous systems dictates the temperature range be limited to 640-700° C. If any part of the liner containing the reaction is at a temperature below 640° C., LnO(OH) will preferentially crystallize. Small crystals of $Ln_2O_3$ were grown from powdered $Ln_2O_3$ feedstock by spontaneous nucleation using 20 M KOH mineralizer and a temperature range of 660° C. in the hot zone to 640° C. in the cool zone.

Preferred embodiments of the invention have been described using specific terms and devices. The words and terms used are for illustrative purposes only. The words and terms are words and terms of description, rather than of limitation. It is to be understood that changes and variations may be made by those of ordinary skill art without departing from the spirit or scope of the invention, which is set forth in the following claims. In addition it should be understood that aspects of the various embodiments may be interchanged in whole or in part. Therefore, the spirit and scope of the appended claims should not be limited to descriptions and examples herein. Moreover, Applicants hereby disclose all sub-ranges of all ranges disclosed herein These sub-ranges are also useful in carrying out the present invention.

What is claimed is:

1. A method for growing lanthanide oxide crystals having the formula $Sc_2O_3$, comprising the steps of:
   dispersing $Sc_2O_3$ powder in an aqueous solution having an hydroxide ion concentration of from about 1 to about 30 molar; and
   subjecting the solution to a temperature of from about 450° C. to about 700° C. and a pressure of from about 4 kpsi to about 30 kpsi.

2. The method set forth in claim 1 wherein the hydroxide ion concentration is from about 15 to about 25 molar.

3. The method set forth in claim 1 wherein the temperature ranges from about 450° C. to about 550° C.

4. The method set forth in claim 1 wherein the pressure ranges from about 15 kpsi to about 20 kpsi.

5. The method set forth in claim 1 wherein the aqueous solution is subjected to an elevated temperature and pressure for a period of from about one to three weeks.

6. A method for growing lanthanide oxide crystals having the formula $Ln_2O_3$, wherein Ln is selected from the group consisting of the lanthanide elements ranging from La to Lu and Y, comprising the steps of:
   dispersing $Ln_2O_3$ powder in an aqueous solution having an hydroxide ion concentration of from about 1 to about 30 molar; and
   subjecting the solution to a temperature of from about 640° C. to about 750° C. and a pressure of from about 15 kpsi to about 40 kpsi.

7. The method set forth in claim 6 wherein the hydroxide ion concentration is from about 15 to about 25 molar.

8. The method set forth in claim 6 wherein the temperature ranges from about 640° C. to about 750° C.

9. The method set forth in claim 6 wherein the pressure ranges from about 15 kpsi to about 30 kspi.

10. The method set forth in claim 6 wherein the aqueous solution is subjected to an elevated temperature and pressure for a period of from about one to three weeks.

11. A method for growing a lanthanide oxide crystal having the formula $Ln_xLn'_{(2-x)}O_3$ wherein $Ln_x$ is selected from the group consisting of Sc, Y, Gd, La and Lu, and wherein Ln' is selected from the group consisting of Er, Pr, Yb, Nd, Ho, Tm, Th, Cr, Ti and any other lanthanide or transition metal having a 3+ ionic charge, comprising the steps of:
   dispersing $Ln_xLn'_{(2-x)}O_3$ powder in an aqueous solution having an hydroxide ion concentration of from about 1 to about 20 molar; and
   subjecting the solution to a temperature of from about 450° C. to about 700° C. and a pressure of from about 10 kpsi to about 30 kpsi.

12. A method for growing a lanthanide oxide crystal having the formula $Ln_2O_3$ wherein Ln is selected from the group consisting of Sc, Y, La, Lu, and Gd, comprising the steps of:
   providing a pressure vessel having a growth region and a nutrient region;
   providing a seed crystal having the formula $Ln_2O_3$ wherein Ln is selected from the group consisting of Sc, Y, La, Lu, and Gd;
   positioning the seed crystal in the growth region of the pressure vessel;
   providing a medium comprising a nutrient and a mineralizer in the nutrient region, the nutrient comprising powdered or microcrystalline $Ln_2O_3$ wherein Ln is the Ln of the seed crystal, the mineralizer comprising hydroxide ions; and
   heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 450° C. to about 650° C., the nutrient temperature ranging from about 500° C. to about 750° C., the nutrient temperature being higher than the growth temperature and the pressure ranging from about 4 kpsi to about 30 kpsi.

13. A method for growing a lanthanide oxide crystal having the formula $Ln_xLn'_{(2-x)}O_3$ wherein Ln is selected from the group consisting of Sc, Y, La, Lu, and Gd, and wherein Ln' is selected from the group consisting of Er, Pr, Yb, Nd, Ho, Tm, Tb, Cr, Ti and any other lanthanide or transition metal having a 3+ ionic charge, comprising the steps of:
   providing a pressure vessel having a growth region and a nutrient region;
   providing a seed crystal having the formula $Ln_2O_3$ or $Ln_xLn'_{(2-x)}O_3$ wherein Ln is selected from the group consisting of Sc, Y, La, Lu, and Gd;
   positioning the seed crystal in the growth region of the pressure vessel;
   providing a medium comprising a nutrient and a mineralizer in the nutrient region, the nutrient comprising powdered or microcrystalline $Ln_xLn'_{(2-x)}O_3$ wherein Ln and Ln' are the Ln and Ln' of the seed crystal, the mineralizer comprising hydroxide ions; and
   heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 450° C. to about 650° C., the nutrient temperature ranging from about 500° C. to about 750° C., the nutrient temperature being higher than the growth temperature and the pressure ranging from about 4 kpsi to about 30 kpsi.

* * * * *

UNITED STATES PATENT AND TRADEMARK OFFICE
CERTIFICATE OF CORRECTION

| | | Page 1 of 1 |
|---|---|---|
| PATENT NO. | : 7,563,320 B2 | |
| APPLICATION NO. | : 12/002551 | |
| DATED | : July 21, 2009 | |
| INVENTOR(S) | : Joseph W. Kolis and Colin D. McMillen | |

It is certified that error appears in the above-identified patent and that said Letters Patent is hereby corrected as shown below:

In the Specification

Column 1, Line 5 (insert prior to FIELD OF INVENTION) -- This invention was made with government support under NSF grant number DMR 0305377 awarded by the Division of Materials Research. The government has certain rights in the invention. --

Signed and Sealed this
Twenty-sixth Day of May, 2015

Michelle K. Lee
*Director of the United States Patent and Trademark Office*